United States Patent
Ichimura et al.

(10) Patent No.: US 8,506,705 B2
(45) Date of Patent: Aug. 13, 2013

(54) METHOD FOR MANUFACTURING NITRIDE SINGLE CRYSTAL

(75) Inventors: Mikiya Ichimura, Nagoya (JP); Katsuhiro Imai, Nagoya (JP); Makoto Iwai, Kasugai (JP); Takatomo Sasaki, Suita (JP); Yusuke Mori, Suita (JP); Fumio Kawamura, Suita (JP); Yasuo Kitaoka, Suita (JP)

(73) Assignee: NGK Insulators, Ltd., Nagoya (JP)

( * ) Notice: Subject to any disclaimer, the term of this patent is extended or adjusted under 35 U.S.C. 154(b) by 1008 days.

(21) Appl. No.: 12/556,015

(22) Filed: Sep. 9, 2009

(65) Prior Publication Data

US 2010/0012020 A1 Jan. 21, 2010

Related U.S. Application Data

(63) Continuation of application No. PCT/JP2008/051463, filed on Jan. 24, 2008.

(30) Foreign Application Priority Data

Mar. 27, 2007 (JP) ................................. 2007-081476

(51) Int. Cl.
*C30B 9/00* (2006.01)

(52) U.S. Cl.
USPC .............. 117/73; 117/45; 117/78; 117/79; 117/80; 117/81; 117/82; 117/83; 117/952

(58) Field of Classification Search
USPC .............. 117/45, 78, 79, 80, 81, 82, 83, 952, 117/73
See application file for complete search history.

(56) References Cited

U.S. PATENT DOCUMENTS

| 6,270,569 | B1 * | 8/2001 | Shibata et al. ................. 117/68 |
| 2003/0164138 | A1 | 9/2003 | Sarayama et al. |
| 2004/0226503 | A1 | 11/2004 | Iwata et al. |
| 2005/0098090 | A1 * | 5/2005 | Hirota et al. ..................... 117/2 |
| 2006/0048701 | A1 * | 3/2006 | Feigelson et al. .............. 117/89 |
| 2007/0144427 | A1 | 6/2007 | Iwai et al. |
| 2007/0209575 | A1 | 9/2007 | Iwai et al. |
| 2007/0215035 | A1 | 9/2007 | Kitaoka et al. |
| 2008/0283968 | A1 | 11/2008 | Sasaki et al. |
| 2009/0095212 | A1 | 4/2009 | Ichimura et al. |

FOREIGN PATENT DOCUMENTS

| JP | 11-292679 A1 | 10/1999 |
| JP | 2002-293696 A1 | 10/2002 |
| JP | 2003-292400 A1 | 10/2003 |
| JP | 2004-231447 A1 | 8/2004 |

(Continued)

OTHER PUBLICATIONS

Ryohei Gejo et al., "The Effect of Thermal Convection on LPE Growth of GaN Single Crystals in the Na Flux Method," International Workshop on Nitride Semiconductors 2006 [IWN2006], TuP1-17, p. 363.

*Primary Examiner* — Matthew Song
(74) *Attorney, Agent, or Firm* — Burr & Brown (57) ABSTRACT

A nitride single crystal is produced on a seed crystal substrate 5 in a melt containing a flux and a raw material of the single crystal in a growing vessel 1. The melt 2 in the growing vessel 1 has temperature gradient in a horizontal direction. In growing a nitride single crystal by flux method, adhesion of inferior crystals onto the single crystal is prevented and the film thickness of the single crystal is made constant.

7 Claims, 8 Drawing Sheets
(1 of 8 Drawing Sheet(s) Filed in Color)

(56) References Cited

FOREIGN PATENT DOCUMENTS

| | | |
|---|---|---|
| JP | 2005-154254 A1 | 6/2005 |
| JP | 2005-175275 A1 | 6/2005 |
| JP | 2005-263622 A1 | 9/2005 |
| WO | 2005/095682 A1 | 10/2005 |
| WO | 2005/111278 A1 | 11/2005 |
| WO | 2006/030718 A1 | 3/2006 |

* cited by examiner

METHOD FOR MANUFACTURING NITRIDE SINGLE CRYSTAL

BACKGROUND OF THE INVENTION

1. Field of the Invention

The present invention relates to a method for producing a nitride single crystal.

2. Description of Related Art

Gallium nitride-based III-V nitride has been receiving a great deal of attention as a superior blue light emitting element, and has been practically used in material for light emitting diodes or semiconductor laser diodes. According to methods described in Patent Publications JP 2002-293696A, JP 2003-292400A, WO 2005/095682 A1 and WO 2006/030718 A1, a group-III nitride single crystal is grown by flux method. More specifically, a seed crystal substrate is placed in a uniformly heated flux to grow a single crystal.

JP 2004-231447A discloses that a significantly great temperature difference is established between a gas-liquid interface and a single crystal growing region when a nitride single crystal is grown. The temperature difference in a melt according to an example of this publication is 150° C. or greater.

Further, in JP 2005-154254A, the temperature difference inside a melt is set to 10° C. or greater but not greater than 300° C., and preferably 100° C. or greater but not greater than 200° C.

A method for growing a nitride semiconductor is disclosed in which the method is employed in conjunction with techniques of vibrating an apparatus and installing agitating blades inside a crucible for causing a flow travelling from a gas-liquid interface, where physical contact with a raw material gas is made, to the inside of the raw material liquid (JP 2005-263622A).

Another method for growing nitride is disclosed in which an auxiliary heater is mounted on a lower section of a stainless container to make a raw material uniform by means of thermal convection (TuP1-17, International Workshop on Nitride Semiconductors 2006 [IWN2006]).

SUMMARY OF THE INVENTION

In general, impurity crystals tend to grow at a gas-liquid interface due to a high nitrogen concentration around the interface. Then, the impurity crystals are increasingly deposited on a horizontally placed seed crystal, thereby hampering growth of a single crystal, which has been known for its frequent occurrence. Since the impurity crystals firmly adhere onto the intended crystal, it is difficult to remove the impurity crystals.

When a seed crystal substrate is vertically placed, it can be prevented that the impurity crystals formed at the gas-liquid interface are deposited onto a growth surface of the seed crystal. However, crystal growth preferentially occurs on the growth surface located close to the gas-liquid interface, whereas almost no crystal growth occurs on the seed crystal in the vicinity of a bottom portion of a melt. For this reason, it is not possible to obtain single crystals other than those having a great in-plane thickness distribution.

For the method described in JP 2005-263622A, a large-scale apparatus is required in addition to a necessity for fabricating a complex internal shape of the crucible.

In the method described in TuP1-17, International Workshop on Nitride Semiconductors 2006 [IWN2006], a temperature gradient is created along a vertical direction by mounting the auxiliary heater on the lower section. In this case, an upper portion of the melt is low in temperature, while a lower portion of the melt is high in temperature. In this situation, the melt is agitated by thermal convection between the upper portion and the lower portion of the melt. However, a direction of a flow formed by the thermal convection is uncontrollable, which may cause, in some cases, variations in quality or thickness.

An object of the present invention is, in growing a nitride single crystal by means of flux method, to prevent deposition of impurity crystals onto a single crystal and to ensure a uniform film thickness of the single crystal.

The present invention provides a method of producing a nitride single crystal on a seed crystal in a melt comprising a flux and a raw material of the single crystal in a growth vessel, wherein a temperature gradient is provided in the melt in the growth vessel in a horizontal direction.

The present inventors studied various flows of a melt caused by heating a bottom portion of the melt in the growth vessel. When heat is applied from a bottom of the growth vessel, a thermal convective flow travelling from the bottom portion to the upper portion of the melt is formed, to thereby agitate the melt. However, since the thermal convective flow disorderly moves up from the bottom portion of the melt, the flow becomes turbulent. Therefore, it is considered that the melt randomly contacts the seed crystal substrate, which makes it difficult for a single crystal film to grow in a regularly laminated way. As a result, it is assumed that the obtained single crystal film tends to suffer from nonuniformity of film thickness or other defects.

Figure 1:
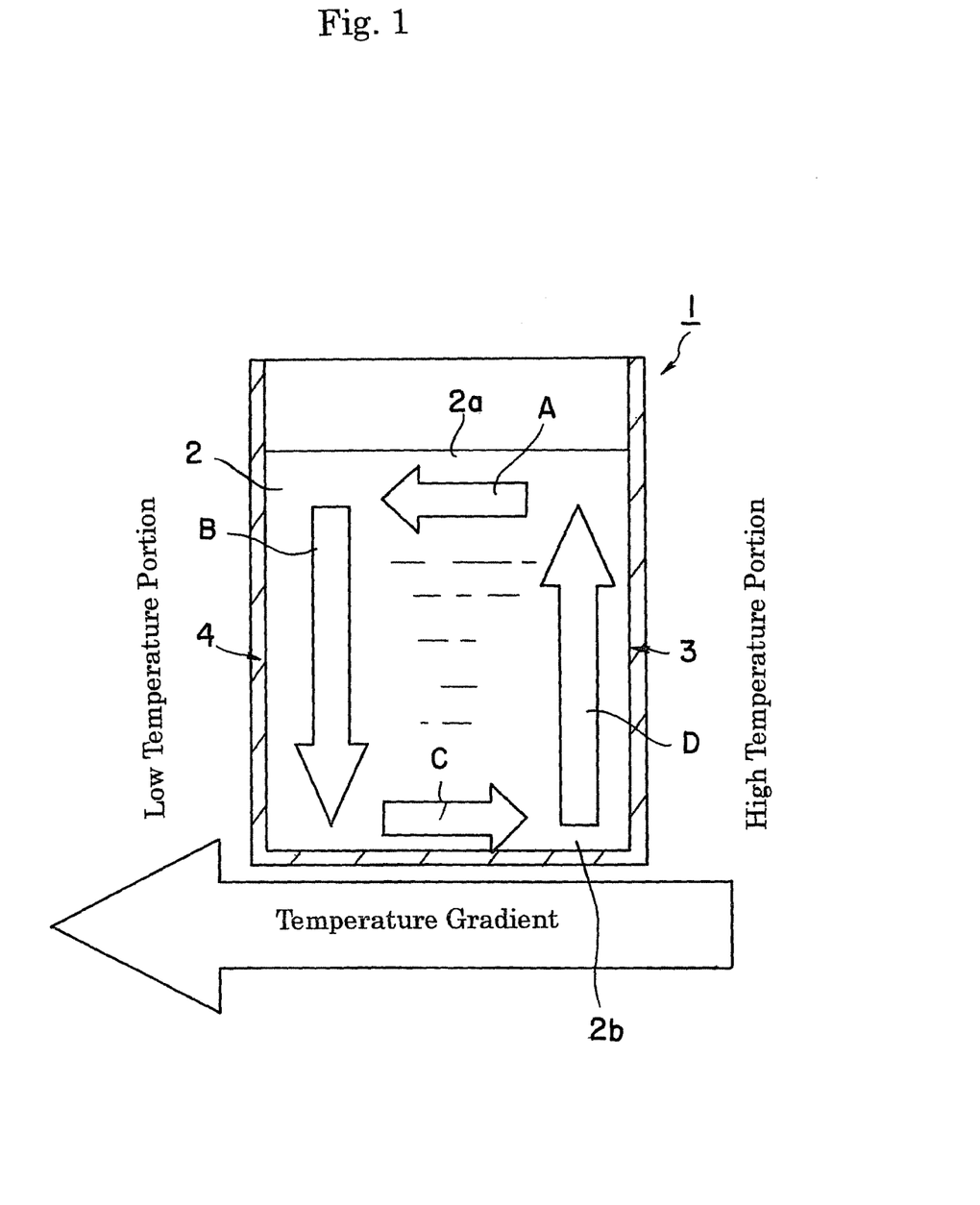
FIG. 1 is a schematic diagram showing a flow of a melt in a growth vessel 1.

Based on these findings, the inventor devised, as schematically shown in FIG. 1, a way of establishing a side wall part 3 on one side of a melt 2 as a high temperature portion while establishing a side wall part 4 on the other side of the melt 2 as a low temperature portion. In this way, a thermal convective flow is formed in a horizontal direction in the vicinity of the gas-liquid interface as indicated by an arrow A. Then, nitrogen is dissolved from the gas-liquid interface, which brings about an increased nitrogen concentration in the melt. The convective flow travels downward as indicated by an arrow B in the low temperature portion 4, then travels as indicated by an arrow C at a bottom part, and travels upward as indicated by an arrow D in the high temperature portion. In this case, the flow has a more well-defined direction than that in a case of providing a vertical temperature gradient, and tends to become a rectified flow. In addition, after nitrogen is dissolved into the melt in the vicinity of the gas-liquid interface, the melt can be supplied as the rectified flow all over the growth vessel. Consequently, the inventors found that since a flow of the melt on a growth surface of the seed crystal substrate was also formed into the rectified flow, the film thickness of the nitride single crystal would be easily rendered uniform, and thus arrived at the present invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

In the present invention, heat is applied on or removed from a side surface of a growth vessel, to thereby create a temperature gradient along a horizontal direction in a melt. In this regard, presence or absence of the temperature gradient is determined as described below. Namely, a temperature measuring apparatus is mounted on one side 3 of an internal wall surface of the growth vessel to measure the temperature of a melt. Further, at the same height as the temperature measuring apparatus, another temperature measuring apparatus is mounted on the opposite side 4 to measure the temperature of the melt. Then, when the temperature of the side 3 differs from that of the side 4, it can be said that the melt has the temperature gradient. The temperature measuring apparatus may be a radiation thermometer or a thermocouple.

The difference in temperature between the high temperature portion 3 and the low temperature portion 4 in the melt is preferably equal to or greater than 3° C., and more preferably equal to or greater than 5° C. in light of effects of the present invention. It should be noted that when the difference in temperature is excessively great, turbulence tends to occur due to thermal convection, and the quality of a nitride single crystal is likely to be reduced. Therefore, it is preferable that the difference in temperature is set to 20° C. or lower, and more preferably 10° C. or lower.

In a preferred embodiment, a difference between the temperature of the melt at a gas-liquid interface and the temperature of the melt at a bottom portion is set to 8° C. or lower. In this way, occurrence of the turbulence due to thermal convection along a vertical direction can be suppressed, to thereby improve the quality of the nitride single crystal. In this aspect, the difference between the temperature of the melt at the gas-liquid interface and the temperature of the melt at the bottom portion is further preferably set to 5° C. or lower, and even further preferably set to 3° C. or lower.

On the other hand, in a preferred embodiment, an angle θ between the gas-liquid interface of the melt and a growth surface of the seed crystal substrate is defined to be 45 degrees or greater but not greater than 135 degrees. Preferably, the angle θ is defined to be 80 degrees or greater but not greater than 100 degrees. It is particularly preferable that the gas-liquid interface of the melt is substantially perpendicular to the growth surface of a seed crystal. In this manner, a tendency of impurity crystals to adhere to the single crystal is further reduced.

Meanwhile, in a preferred embodiment, the growth surface of the seed crystal substrate is directed to a low temperature region of the melt.

Further, in this invention, the angle θ may be smaller than 45 degrees, while the gas-liquid interface of the melt may be substantially parallel to the growth surface of the seed crystal.

Figure 2:
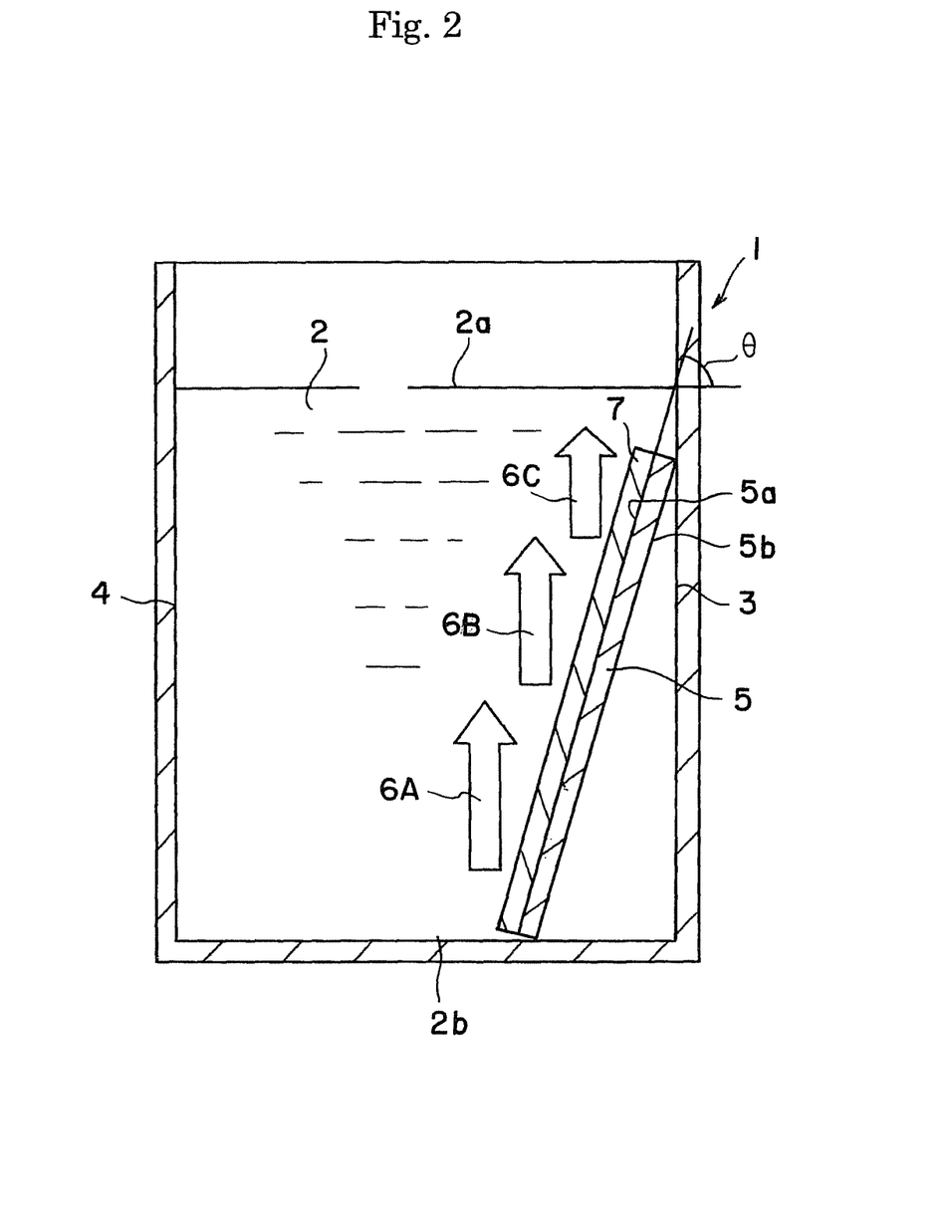
FIG. 2 is a schematic diagram showing solute convection with a seed crystal disposed in a vertical position.
Figure 3:
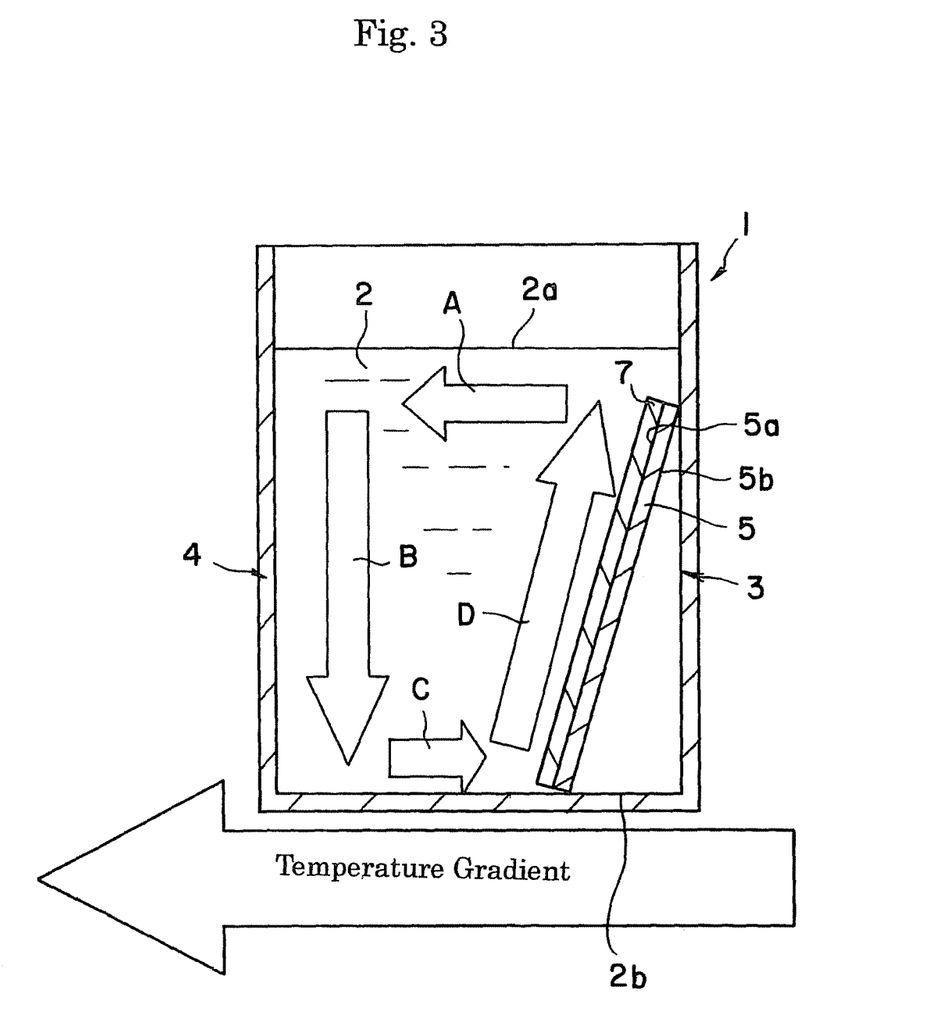
FIG. 3 is a schematic diagram showing a situation in which a single crystal 7 is grown on a seed crystal substrate 5 in the growth vessel 1.

FIGS. 2 and 3 show examples according to the above-described embodiment. A melt 2 is contained in a growth vessel 1, and a seed crystal substrate 5 is immersed in the melt 2. A growth surface 5a of the seed crystal substrate is preferably directed to a low temperature portion 4, while the seed crystal substrate is preferably placed on a location closer to a high temperature portion 3. A nitride single crystal 7 is grown on the growth surface 5a. Reference character 2a represents the gas-liquid interface, and reference character 2b represents a bottom portion of the melt. Solute convection occurs in the melt. More specifically, when a nitride single crystal such as GaN, for example, is epitaxially grown on the growth surface 5a, the melt moves up, as indicated by arrows 6A, 6B and 6C, in the vicinity of the growth surface 5a toward the gas-liquid interface as a density of the melt changes during deposition.

Here, in this example, the angle θ between the gas-liquid interface 2a of the melt and the growth surface 5a of the seed crystal substrate is defined to be 45 degrees or greater but not greater than 135 degrees, and the growth surface 5a of the seed crystal substrate is directed to the low temperature portion 4, while the seed crystal substrate itself is placed on the location closer to the high temperature portion 3. In this case, directions of the solute convection flows 6A, 6B and 6C substantially correspond to directions of the upward flow D formed by the temperature gradient. As a result, the rectified flow is further stabilized in the vicinity of the growth surface 5a, which, in turn, facilitates transportation of nitrogen further.

Thus, since nitrogen was transported into the melt, thereby equalizing the nitrogen concentration, the film thickness of the nitride single crystal grown on the seed crystal became less dependent on a level of liquid and became more uniform. In addition, a way of growing the nitride single crystal in the flow circulated in one direction without stagnation brought about a fact that the nitride single crystal preferentially exhibits step growth (two-dimensional growth). The nitride single crystal grown in steps includes fewer impurities, and thus has a high degree of transparency.

Figure 4:
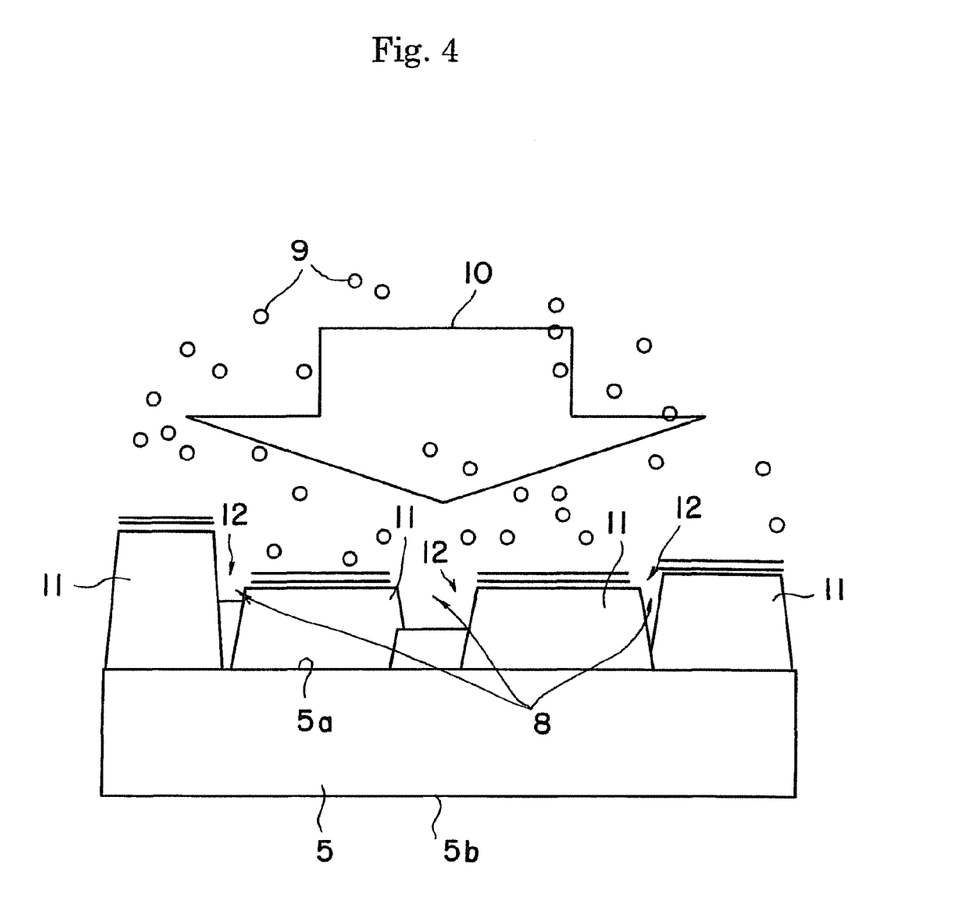
FIG. 4 is a schematic diagram for explaining a relationship between solute diffusion and nonuniformity in film thickness on the seed crystal substrate.

The above points will be described in further detail. It is assumed that, in a model shown in FIG. 4, there is no thermal convective flow, and a raw material metal element 9 is transported through diffusion 10 in the melt, and arrives at the growth surface 5a of the seed crystal substrate 5. In this instance, tabular single crystals 11 are epitaxially grown on the growth surface 5a. However, since stagnation 8 tends to occur in gaps between adjacent layers of the single crystals 11, the film thickness and film quality are prone to being nonuniform in regions 12 of the stagnation 8.

Figure 5:
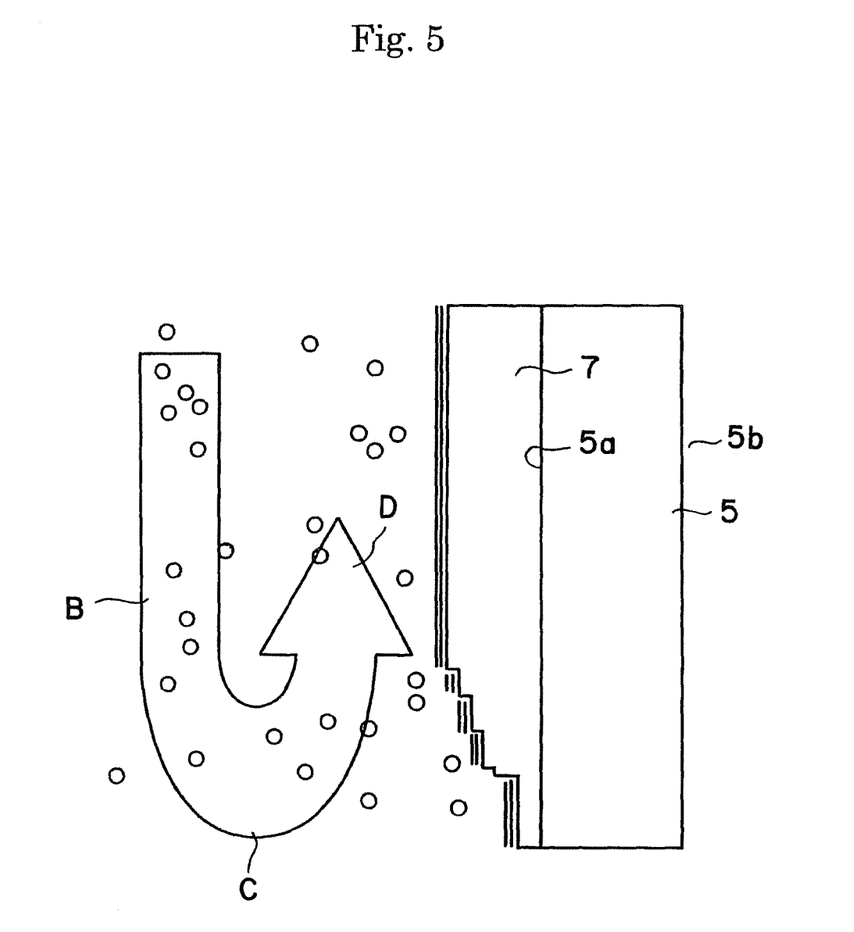
FIG. 5 is a schematic diagram for explaining the principle based on which a film thickness of a single crystal is rendered uniform according to the present invention.

In the present invention, on the other hand, since the rectified flow indicated by the arrows B, C and D is formed as shown in FIG. 5, a tendency of the melt to stagnate on the growth surface 5a is reduced, and the nonuniform regions 12 hardly occur, with a result that the film thickness is easily rendered uniform.

In this invention, a method of creating the temperature gradient along the horizontal direction in the melt is not specifically limited, and the method may, by way of illustration, include:

(1) installing a source of heat generation in the high temperature portion;

(2) increasing an amount of heat liberated by a heater for the high temperature portion, while decreasing the amount of heat liberated by a heater for the low temperature portion; and (3) creating a horizontal temperature gradient to a temperature distribution in an internal space of a furnace in which the growth vessel is installed, to thereby provide the horizontal temperature distribution to the melt in the growth vessel.

Figure 6:
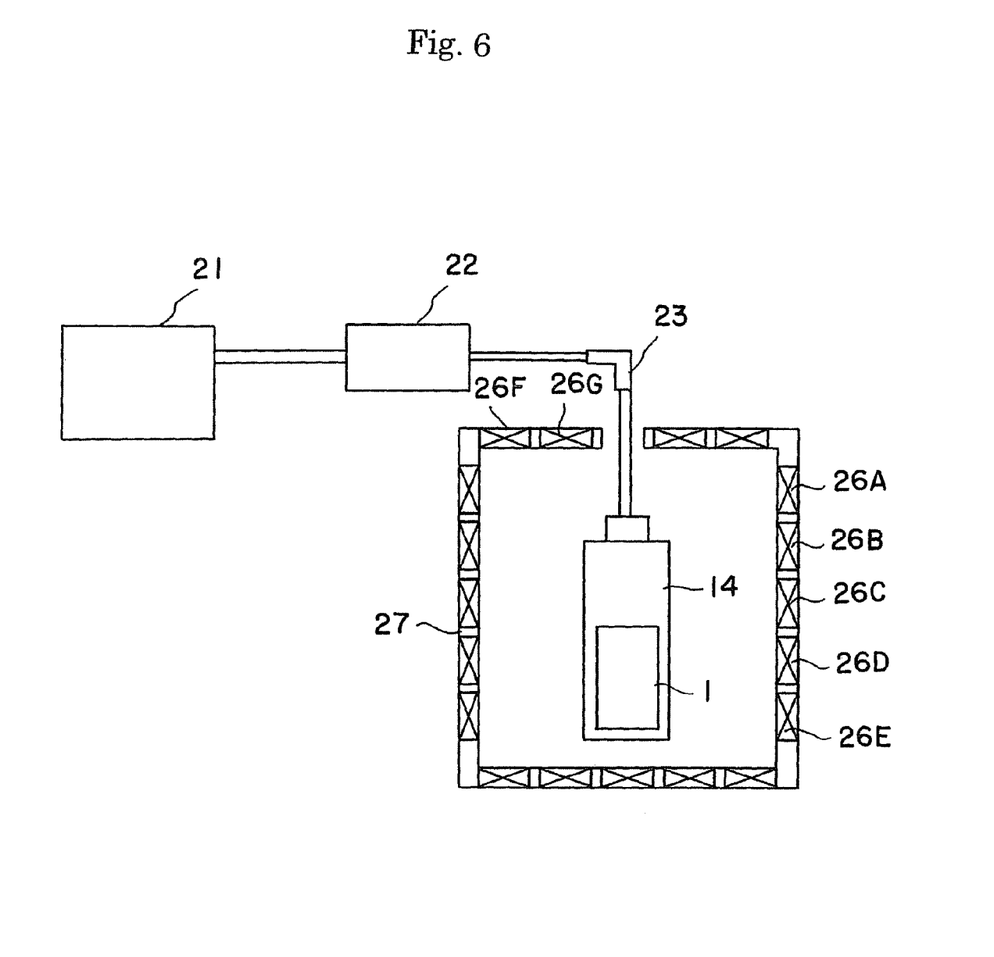
FIG. 6 is a schematic diagram showing a growth apparatus which can be used in the present invention.
Figure 7:
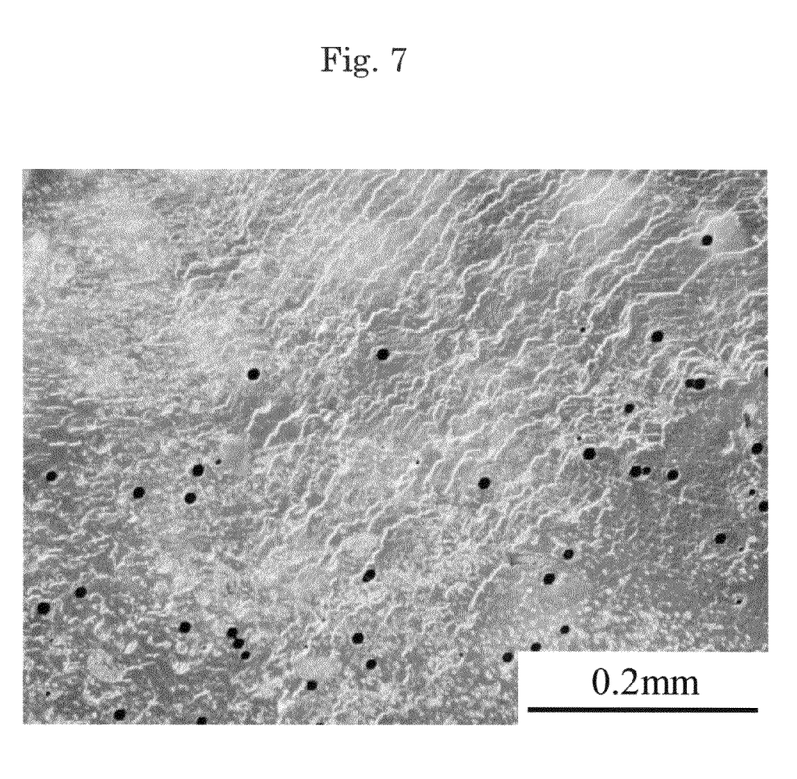
FIG. 7 shows a photograph of a GaN single crystal surface taken by a differential interference microscope.

In a preferred embodiment, as schematically shown in FIG. 6, a plurality of heating elements 26A, 26B, 26C, 26D, 26E, 26F and 26G are disposed along vertical and horizontal directions, and the amount of heat generation is independently controlled for each of the heating elements. In other words, multi-zone control is performed along the vertical direction and the horizontal direction. While causing each of the heating elements to generate heat, a nitrogen containing atmosphere is introduced through a gas tank 21, a pressure controller 22, and a pipe 23 into the growth vessel 1 inside an atmosphere controlling container 14, and the introduced nitrogen containing atmosphere is heated and pressurized, so that all mixed raw materials are dissolved within the growth vessel to thereby generate a melt. Here, single crystal growing conditions according to the present invention are maintained by regulating the amount of heat liberated by each of the heating elements in the horizontal direction.

A material of the heating element is not specifically limited in the present invention, and the heating element includes, for example, an alloy heating element composed of an alloy, such as an iron-chromium-aluminum based alloy or a nickel-chromium based alloy; a refractory metal heating element composed of a high melting point metal such as platinum, molybdenum, tantalum, or tungsten; and a non-metal heating element composed of a nonmetal such as silicon carbide, molybdenum silicide, or carbon.

In the single crystal growing apparatus according to the present invention, a unit for heating a raw material mixture to generate the melt is not specifically limited. Although it is preferable that the unit is a hot isostatic press, other atmosphere pressurized heating furnaces may be used.

Although the flux used for generating the melt is not specifically limited, one or more metals selected from a group consisting of alkali metals and alkali earth metals, or an alloy of the one or more metals may be preferably used. Such metal includes, for example, lithium, sodium, potassium, rubidium, cesium, beryllium, magnesium, calcium, strontium and barium. Among these metals, lithium, sodium and calcium are particularly preferable, and sodium is most preferable.

Examples of a substance to be alloyed with the one or more metals selected from the group consisting of alkali metals and alkali earth metals include the following metals: gallium, aluminum, indium, boron, zinc, silicon, tin, antimony, and bismuth.

According to a growth method of the present invention, for example, single crystals such as GaN, AlN, or InN, a mixed crystal thereof (AlGaInN), and BN can be preferably grown.

A heating temperature and a pressure used in a single crystal growing process are selected depending on a type of single crystal, and thus are not specifically limited. The heating temperature may be set, for example, at from 800 to 1500° C., preferably from 800 to 1200° C., and more preferably from 900 to 1100° C. The pressure, which is not particularly limited as well, is preferably equal to or greater than 1 MPa, and more preferably equal to or greater than 10 MPa. An upper limit of the pressure is not particularly defined, but may be established, for example, at 200 MPa or lower, and preferably at 100 MPa or lower.

The material of the growth vessel in which reaction is caused is not specifically limited, and may be any material which is durable under intended heating and pressurizing conditions. This material as described above includes a high-melting point metal, such as metallic tantalum, tungsten or molybdenum; an oxide, such as alumina, sapphire or yttria; a nitride ceramics, such as aluminum nitride, titanium nitride, zirconium nitride or boron nitride; a carbide of high-melting point metal, such as tungsten carbide or tantalum carbide; and a thermal decomposition product such as p-BN (pyrolytic BN) or p-Gr (pyrolytic graphite).

Next, more specific single crystals and growing procedures thereof will be described by way of illustration.

(Growth Example of Gallium Nitride Single Crystal)

The present invention can be used to grow gallium nitride single crystals through the use of a flux containing at least sodium metal. A gallium raw material is dissolved in the flux. A gallium single metal, a gallium alloy, or a gallium compound may be used as the gallium raw material, but the gallium single metal is preferably used in terms of handle ability.

Metal other than sodium, such as lithium may be contained in the flux. Although a proportion of the gallium raw material and the flux raw material such as sodium to be used may be appropriately defined, the use of an excess amount of sodium may be generally considered, which is not restrictive, of course.

In this embodiment, a gallium nitride single crystal is grown in an atmosphere of mixed gas containing a nitrogen gas under a total pressure of 1 MPa or higher but not higher than 200 MPa. When the total pressure was defined to be 1 MPa or higher, a gallium nitride single crystal having excellent quality could be grown in a high temperature range of, for example, 800° C. or higher, or more preferably 900° C. or higher.

In a preferred embodiment, a nitrogen partial pressure in the atmosphere during growth is set at 1 MPa or higher but not higher than 200 MPa. When the nitrogen partial pressure was defined to be 1 MPa or higher, dissolution of nitrogen into the flux could be facilitated, for example, in the high temperature range of 800° C. or higher, thereby allowing growth of a high-quality gallium nitride single crystal. From this aspect, it is further preferable that the nitrogen partial pressure in the atmosphere is set to 2 MPa or higher. On the other hand, it is practically preferable that the nitrogen partial pressure does not exceed 100 MPa.

Although the gas other than nitrogen in the atmosphere is not specified, an inert gas is preferred, and argon, helium, or neon is particularly preferred. The partial pressure of the gas other than nitrogen is a value obtained by subtracting the nitrogen gas partial pressure from the total pressure.

In a preferred embodiment, the growth temperature of the gallium nitride single crystal is set to 800° C. or higher, preferably 900° C. or higher, and more preferably 1000° C. or higher. Even in a region of such high temperatures, it is possible to grow high-quality gallium nitride single crystals. In addition, there is a possibility that growth at the high temperatures and high pressures contributes to improvement in productivity.

An upper limit on the growth temperature of the gallium nitride single crystal is not specified. However, it is preferable to define the upper limit on the growth temperature of 1500° C. or lower since an excessively high growth temperature brings about difficulty in growth of crystals. From this point of view, it is more preferable that the upper limit is defined to be 1200° C. or lower.

The material of the growth substrate for epitaxially growing the gallium nitride crystals includes, but not limited to, sapphire; AlN template; GaN template; silicon single crystal; SiC single crystal; MgO single crystal; spinel ($MgAl_2O_4$); $LiAlO_2$; $LiGaO_2$; and perovskite composite oxide such as $LaAlO_3$, $LaGaO_3$, and $NdGaO_3$. In addition, cubic perovskite composite oxides represented by a composition formula of $[A_{1-y}(Sr_{1-x}Ba_x)_y][(Al_{1-z}Ga_z)_{1-u}\cdot Du]O_3$ (where A is a rare earth element; D is one or more elements selected from a group consisting of niobium and tantalum; y=0.3-0.98; x=0-1; z=0-1; u=0.15-0.49; and x+z=0.1-2) may be also used. Further, SCAM ($ScAlMgO_4$) may be also used.

(Growth Example of AlN Single Crystal)

The present invention has proven effective when an AlN single crystal is grown by pressurizing a melt containing a flux which includes at least aluminum and alkaline earth in a nitrogen containing atmosphere under a specific condition.

EXAMPLES

Example 1

A GaN single crystal was grown according to the method of the present invention which has been described with reference to FIGS. 1 to 7.

Specifically, 3 g of metallic gallium (Ga) as a group-III raw material and 4 g of metallic sodium (Na) as a flux were weighed, and placed along with the seed crystal substrate 5 in the growth vessel 1 with a diameter of 2 cm. A thin film of gallium nitride single crystal epitaxially grown on sapphire was used as the seed crystal substrate 5. The growth vessel 1 was placed in the atmosphere controlling container 14 having a gas feed port, and subsequently, the atmosphere controlling container 14 was sealed. A series of these operations were performed in an inert gas atmosphere to prevent oxidation of the raw material, the flux, and others. After placing the sealed container 14 inside the electric furnace 27 equipped with the plurality of heating elements 26A to 26G which generate individually controllable amounts of heat, the gas tank 21 was connected via the pressure controller 22 to the gas feed port.

Then, outputs from the plurality of heating elements attached to the electric furnace were adjusted in such a manner that a temperature TW1 of an interface (the high temperature portion) 3 between the melt and a wall surface (side wall) in a crucible would be 870° C., a temperature TW2 of an interface (the low temperature portion) 4 between the melt and the wall surface in the crucible would be 860° C., a temperature TS of the gas-liquid interface would be 865° C., and a temperature TB of a bottom portion of the melt would be 865° C. at the time of growing the single crystal. The growth was carried out for 150 hours under a nitrogen gas pressure of 4.0 MPa. Upon completion of the process, the atmosphere controlling container was cooled down, and the growth vessel was taken out therefrom. Then, the flux was removed by means of reaction with ethanol, to thereby retrieve the GaN single crystal grown on the seed crystal.

As a result of the above process, there was no impurity crystal formed at the gas-liquid interface of the melt. In addition, deposition of the impurity crystals onto the GaN single crystal was not found. As shown in a differential interference microscope image of FIG. 7, the surface of the crystal exhibited step growth, and a film surface was smooth in a broad area. A thickness Y1 of the grown GaN single crystal in the vicinity of the gas-liquid interface, a thickness Y2 of a central portion of the grown GaN single crystal, and a thickness Y3 of the grown GaN single crystal in the vicinity of the bottom portion of the melt were 950 µm, 930 µm, and 900 µm respectively.

In a manner similar to the above-described process, the GaN single crystal was grown on the seed crystal substrate two more times. The thicknesses (Y1, Y2 and Y3) of the grown GaN single crystal measured 900 µm, 960 µm and 800 µm at the second experiment, and measured 1000 µm, 900 µm and 950 µm at the third experiment.

Example 2

Metallic gallium (Ga) as the group-III raw material and metallic sodium (Na) as the flux were weighed, and placed along with the seed crystal substrate in a growth vessel with a diameter of 6 cm. The Ga and Na were weighed so as to obtain the level of liquid of 2 cm when they were dissolved. The seed crystal substrate was placed on the bottom of the growth vessel with the growth surface being substantially parallel to the gas-liquid interface. The thin film of gallium nitride single crystal epitaxially grown on sapphire was used as the seed crystal substrate. The growth vessel was placed in the atmosphere controlling container 14 having the gas feed port, and the atmosphere controlling container 14 was subsequently sealed. A series of the above operations were performed in the inert gas atmosphere to prevent oxidation of the raw material, the flux, and others. After placing the sealed container 14 inside the electric furnace 27 equipped with the plurality of heating elements 26A to 26G which generate individually controllable amounts of heat, the gas tank 21 was connected via the pressure controller 22 to the gas feed port.

Then, outputs from the plurality of heating elements attached to the electric furnace were adjusted in such a manner that the temperature TW1 of the interface (the high temperature portion) 3 between the melt and the wall surface (side wall) in the crucible would be 880° C., the temperature TW2 of the interface (the low temperature portion) 4 between the melt and the wall surface in the crucible would be 870° C., the temperature TS of the gas-liquid interface would be 875° C., and the temperature TB of the bottom portion of the melt would be 875° C. at the time of growing the single crystal. The growth was carried out for 200 hours under a nitrogen gas pressure of 4.5 MPa. Upon completion of the process, the atmosphere controlling container was cooled down, and the growth vessel was taken out therefrom. Then, the flux was removed by means of reaction with ethanol, to thereby retrieve the GaN single crystal grown on the seed crystal.

As a result of the above process, there was no impurity crystal formed at the gas-liquid interface of the melt. In addition, deposition of the impurity crystals onto the GaN single crystal was not found. The surface of the crystal was relatively smooth. A quantity of crystal growth measured 1000 µm in the thickest part, and 800 µm in the thinnest part.

Comparative Example 1

A GaN single crystal was grown in a manner similar to that of Example 1. At the time of growing the single crystal, however, the temperature TW1 of the interface (the high temperature portion) 3 between the melt and the wall surface (side wall) inside the crucible was set to 865° C., the temperature TW2 of the interface (the low temperature portion) 4 between the melt and the wall surface inside the crucible was set to 865° C., the temperature TS of the gas-liquid interface was set to 860° C., and the temperature TB of the bottom portion of the melt was set to 870° C. The growth was carried out for 150 hours under the nitrogen gas pressure of 4.0 MPa. Upon the completion of the process, the retrieved GaN single crystal had the thicknesses of Y1=500 µm, Y2=350 µm and Y3=540 µm.

Similarly to the above process, the GaN single crystal was grown two more times on the seed crystal substrate. The thicknesses (Y1, Y2 and Y3) of the grown GaN single crystal measured 600 µm, 250 µm and 300 µm at the second experiment, and measured 800 µm, 600 µm and 850 µm at the third experiment.

Comparative Example 2

A GaN single crystal was grown in a manner similar to that of Example 2. However, the outputs from the plurality of heating elements attached to the electric furnace were adjusted in such a manner that the single crystal growth temperatures would be equalized as TW1=TW2=TS=TB=875° C. The growth was carried out for 200 hours under the nitrogen gas pressure of 4.5 MPa. Upon completion of the process, the atmosphere controlling container was cooled down, and the growth vessel was taken out therefrom. Then, the flux was removed by means of reaction with ethanol, to thereby retrieve the GaN single crystal grown on the seed crystal. As the result of the above process, impurity crystals were formed at the gas-liquid interface of the melt, and deposition of the impurity crystals onto the GaN single crystal was also found. The quantity of crystal growth measured 400 µm in the thickest part, and 100 µm in the thinnest part.

Figure 8:
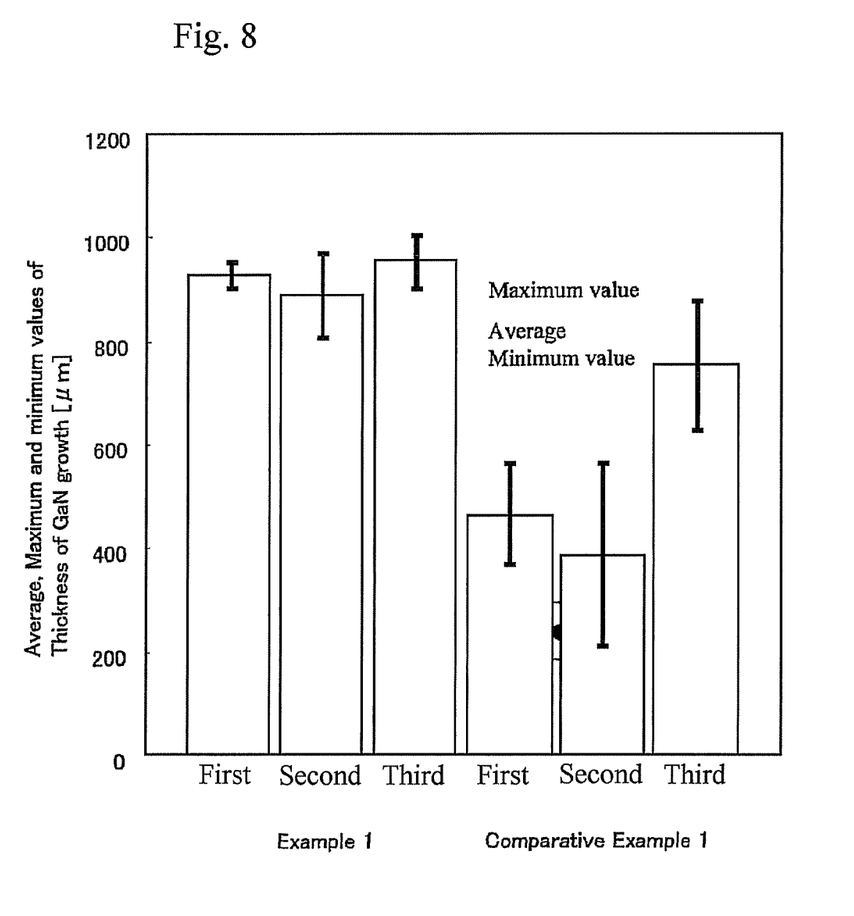
FIG. 8 is a graph showing a distribution of thicknesses of a GaN film in Example 1 and Comparative Example 1.

The results of Example 1 and Comparative Example 1 were summarized on Table 1 and depicted in FIG. 8. Example 1, in which average values of in-plane thicknesses of 927 µm, 887 µm and 950 µm were obtained, was highly reproducible. Since variation in the in-plane thicknesses [(the maximum value−the minimum value)/the average value] was 20% or below, uniformity of the film thickness was excellent.

TABLE 1

| | Example 1-1 | Example 1-2 | Example 1-3 | Com. Example 1-1 | Com. Example 1-2 | Com. Example 1-3 |
|---|---|---|---|---|---|---|
| TW1 (° C.) | | 870 | | | 865 | |
| TW2 (° C.) | | 860 | | | 865 | |
| TS (° C.) | | 865 | | | 860 | |
| TB (° C.) | | 865 | | | 870 | |
| Y1 (μm) | 950 | 900 | 1000 | 500 | 600 | 800 |
| Y2 (μm) | 930 | 960 | 900 | 350 | 250 | 600 |
| Y3 (μm) | 900 | 800 | 950 | 540 | 300 | 850 |
| Average Value (μm) | 927 | 887 | 950 | 463 | 383 | 750 |
| Maximum − Minimum (μm) | 50 | 160 | 100 | 190 | 350 | 250 |
| (Maximum − Minimum)/Average Value (%) | 5.4 | 18.0 | 10.5 | 41.0 | 91.3 | 33.3 |

Although the specific embodiments of the present invention have been described, the present invention is not limited to the specific embodiments, and may be implemented while applying various changes or modifications without departing from the scope of the appended claims.

The invention claimed is:

1. A method of producing a nitride single crystal, said method comprising:
    immersing a seed crystal substrate having a growth surface in a melt comprising a flux and a raw material for the single crystal in a growth vessel to grow the nitride single crystal on the growth surface of the seed crystal substrate, wherein a temperature gradient is provided in a horizontal direction in the melt in the growth vessel,
    wherein the gas-liquid interface of the melt is substantially parallel with the growth surface of the seed crystal substrate.

2. The method of claim 1, wherein a difference in temperature in the horizontal direction of the melt in the growth vessel is set to 3° C. or higher and 20° C. or lower.

3. The method of claim 1, wherein a difference between a temperature at a gas-liquid interface of the melt and a temperature at a bottom portion of the melt is set to 8° C. or lower.

4. The method of claim 2, wherein a difference between a temperature at a gas-liquid interface of the melt and a temperature at a bottom portion of the melt is set to 8° C. or lower.

5. The method of claim 2, wherein the gas-liquid interface of the melt is substantially parallel with the growth surface of the seed crystal substrate.

6. The method of claim 3, wherein the gas-liquid interface of the melt is substantially parallel with the growth surface of the seed crystal substrate.

7. The method of claim 1, wherein the growth vessel comprises one side wall part and an opposing side wall part,
    wherein the temperature gradient in the melt is from a high temperature region along the one side wall part maintained at a high temperature to a low temperature region along the opposing side wall part maintained at a low temperature, and
    wherein a thermal convection flow is generated horizontally in the vicinity of the gas-liquid interface, downwardly in the low temperature region, horizontally in a bottom part and upwardly in the high temperature region.

* * * * *